(12) United States Patent
Noda

(10) Patent No.: US 12,364,117 B2
(45) Date of Patent: Jul. 15, 2025

(54) FLEXIBLE DISPLAY PANEL AND MANUFACTURING METHOD OF FLEXIBLE DISPLAY PANEL

(71) Applicant: JOLED INC., Tokyo (JP)

(72) Inventor: Makoto Noda, Tokyo (JP)

(73) Assignee: JDI DESIGN AND DEVELOPMENT G.K., Chicago, IL (US)

( * ) Notice: Subject to any disclaimer, the term of this patent is extended or adjusted under 35 U.S.C. 154(b) by 702 days.

(21) Appl. No.: 17/650,760

(22) Filed: Feb. 11, 2022

(65) Prior Publication Data

US 2022/0262280 A1 Aug. 18, 2022

(30) Foreign Application Priority Data

Feb. 17, 2021 (JP) ................. 2021-023291

(51) Int. Cl.
| | |
|---|---|
| *H10K 59/131* | (2023.01) |
| *G09F 9/30* | (2006.01) |
| *H10K 71/00* | (2023.01) |
| *H10K 77/10* | (2023.01) |
| *H10K 102/00* | (2023.01) |

(52) U.S. Cl.
CPC .......... *H10K 59/131* (2023.02); *G09F 9/301* (2013.01); *H10K 71/00* (2023.02); *H10K 77/111* (2023.02); *H10K 2102/311* (2023.02)

(58) Field of Classification Search
CPC ......... G09F 9/301; G09F 9/33; H10K 59/131; H10K 71/00; H10K 77/111; H10K 2102/311; H10K 71/851; B23K 26/38; H01L 21/02068
See application file for complete search history.

(56) References Cited

U.S. PATENT DOCUMENTS

| | | | | |
|---|---|---|---|---|
| 11,335,884 | B2 * | 5/2022 | Andou | ................ H10K 50/844 |
| 2017/0294621 | A1 * | 10/2017 | Higano | ............... G02F 1/13452 |
| 2017/0359899 | A1 | 12/2017 | Heo et al. | |
| 2019/0247955 | A1 * | 8/2019 | Kim | ..................... B23K 26/082 |
| 2020/0381662 | A1 * | 12/2020 | Andou | ................... H05B 33/06 |

FOREIGN PATENT DOCUMENTS

| | | |
|---|---|---|
| CN | 107492566 A | 12/2017 |
| CN | 109865710 A | 6/2019 |
| JP | 2020071968 A | 5/2020 |

OTHER PUBLICATIONS

Search Report for Chinese Application No. 202210123265.5, mailed on Dec. 23, 2024.

* cited by examiner

*Primary Examiner* — J. E. Schoenholtz
(74) *Attorney, Agent, or Firm* — CHIP Law Group

(57) ABSTRACT

Provided is a flexible display panel including a display portion for display and a terminal portion around the display portion, in which each of the display portion and the terminal portion includes a flexible substrate including a first main surface and a second main surface on an opposite side of the first main surface, the flexible substrate containing resin, and a wiring layer formed on the first main surface of the flexible substrate, the terminal portion includes an inclined surface inclined toward the display portion from the second main surface side to the first main surface side, and a width of the inclined surface in plan view of the flexible display panel is equal to or greater than 13.1 µm.

11 Claims, 8 Drawing Sheets

| POWER (W) | 10 | | |
|---|---|---|---|
| SCAN (Cycle) | 10 | | 30 |
| FOCUS (mm) | 0 | -2.0 | -4.0 |
| TERMINAL STATE |  |  |  |

FIG.11

| | | FOCUS | | | |
|---|---|---|---|---|---|
| | | +0.2 mm | 0mm | -1.0 mm | -2.0 mm |
| LASER POWER | 1.7W 18scan | NG | | | |
| | 3.0W 10scan | | OK | | |
| | 5.0W 10scan | | OK | OK | |
| | 10W 10scan | | OK | | OK |

RESISTANCE BETWEEN TERMINALS: HIGH

FIG.12

| RECESS LENGTH (μm) | RESISTANCE VALUE DETERMINATION RESULT |
|---|---|
| 6.8 | NG |
| 13.1 | OK |
| 13.4 | OK |
| 14.6 | OK |
| 16.3 | OK |
| 19.8 | OK |
| 24.7 | OK |
| 46.7 | OK |

FLEXIBLE DISPLAY PANEL AND MANUFACTURING METHOD OF FLEXIBLE DISPLAY PANEL

CROSS REFERENCE TO RELATED APPLICATIONS

The present application claims priority benefit of Japanese Patent Application No. JP 2021-023291 filed in the Japan Patent Office on Feb. 17, 2021 the entire content of which is hereby incorporated by reference.

BACKGROUND

The present disclosure relates to a flexible display panel and a manufacturing method of the flexible display panel.

In recent years, the development of a flexible display panel including a flexible substrate as a substrate is underway. A scribe apparatus with a mechanical blade or a laser apparatus (laser processing apparatus) is used to process a terminal portion or other components of the flexible display panel during manufacturing (see Japanese Patent Laid-Open No. 2020-71968). An example of the process includes cutting.

A laser apparatus may be used instead of a scribe apparatus to execute a laser cutting process in the flexible display panel for the purpose of reducing the stress during the cut and preventing a crack (for example, crack of terminal portion).

However, carbide may remain on a cut end surface in the laser apparatus of Japanese Patent Laid-Open No. 2020-71968.

As such, the present disclosure realizes a flexible display panel and a manufacturing method of the flexible display panel that can prevent carbide from being left on a cut end surface when laser cutting is performed.

SUMMARY

A mode of the present disclosure provides a flexible display panel including a display portion for display and a terminal portion around the display portion, in which each of the display portion and the terminal portion includes a flexible substrate including a first main surface and a second main surface on an opposite side of the first main surface, the flexible substrate containing resin, and a wiring layer formed on the first main surface of the flexible substrate, the terminal portion includes an inclined surface inclined toward the display portion from the second main surface side to the first main surface side, and a width of the inclined surface in plan view of the flexible display panel is equal to or greater than 13.1 μm.

A mode of the present disclosure provides a manufacturing method of a flexible display panel including a display portion for display and a terminal portion around the display portion, each of the display portion and the terminal portion including a flexible substrate including a first main surface and a second main surface on an opposite side of the first main surface, the flexible substrate containing resin, and a wiring layer formed on the first main surface of the flexible substrate, the manufacturing method including cutting, by using a laser, the terminal portion such that the terminal portion has a slope toward the display portion from the second main surface side to the first main surface side, and cleaning, by dry cleaning, an inclined surface formed in the cutting, in which a width of the inclined surface formed in the cutting is equal to or greater than 13.1 μm in plan view of the flexible display panel.

The flexible display panel and the manufacturing method of the flexible display panel according to a mode of the present disclosure can prevent carbide from being left on the cut end surface when the laser cutting is performed.

BRIEF DESCRIPTION OF THE DRAWINGS

FIG. 11 depicts a relation between laser conditions, focus, and resistance between terminals according to the embodiment; and FIG. 12 depicts verification results regarding recess length and resistance value determination results according to the embodiment.

DETAILED DESCRIPTION OF THE PREFERRED EMBODIMENTS

Figure 1:
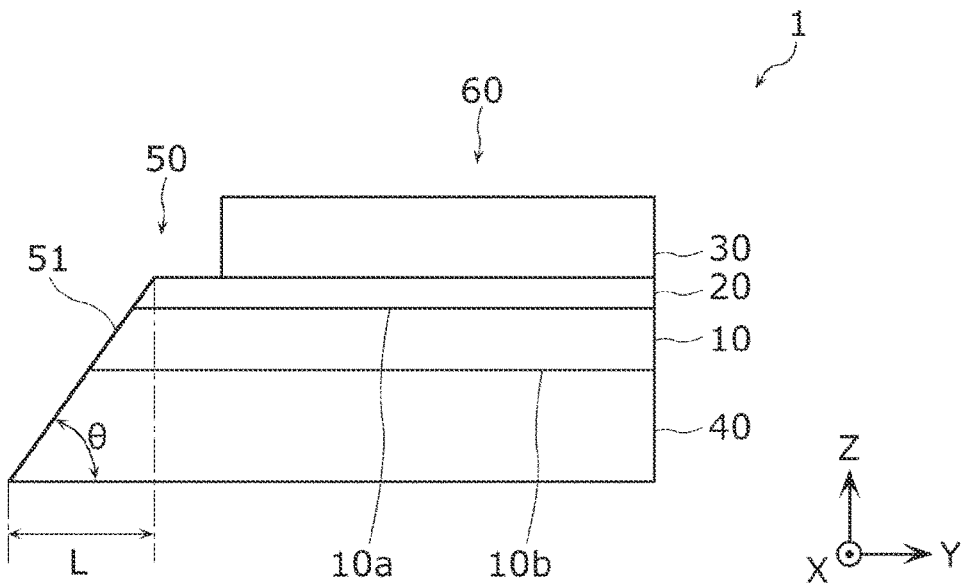
FIG. 1 is a side view illustrating an appearance of a flexible display panel according to an embodiment.

Embodiments of the present disclosure will now be described with reference to the drawings. Note that each of the embodiments described below illustrates a specific example of the present disclosure. Hence, values, shapes, materials, constituent elements, arrangement positions and connection modes of the constituent elements, steps, and orders of the steps illustrated in the following embodiments are examples and are not intended to limit the present disclosure. Therefore, the constituent elements not described in the independent claims of the present disclosure among the constituent elements in the following embodiments are described as freely-selected constituent elements.

Note that the drawings are schematic diagrams, and the drawings are not necessarily depicted exactly. In the drawings, the same signs are provided to substantially the same components, and duplicate description will be omitted or simplified.

In the present specification, such terms as parallel and equal indicating relations between elements, such terms as rectangle indicating shapes of elements, values, and ranges of the values are not expressions representing only the exact meaning, but are expressions meant to also include substantially equivalent ranges, such as differences of approximately several percent. Although such expressions as certain are also used, the expressions are meant to also include substantially certain ranges, such as differences of approximately several percent.

In the present specification and the drawings, an X-axis, a Y-axis, and a Z-axis represent three axes of a three-dimensional Cartesian coordinate system. In the embodiments, the Z-axis direction is the stack direction of constituent elements of a flexible display panel. The Y-axis direction is the extension direction of a terminal portion. In the present specification, "in plan view" represents a view from the Z-axis direction, and "in side view" represents a view from the X-axis direction.

Embodiment

1. Configuration of Flexible Display Panel

First, a configuration of the flexible display panel according to the present embodiment will be described with reference to FIG. 1. FIG. 1 is a side view illustrating an appearance of a flexible display panel 1 according to the present embodiment.

As illustrated in FIG. 1, the flexible display panel 1 includes a flexible substrate 10, a wiring layer 20, a first protection layer 30, and a second protection layer 40. The second protection layer 40, the flexible substrate 10, the wiring layer 20, and the first protection layer 30 are stacked in this order to form the flexible display panel 1. Note that a light-emitting layer and other layers are not illustrated in FIG. 1.

The flexible display panel 1 is a bendable thin display and is, for example, a flexible organic electro luminescence (EL) panel. However, the flexible display panel 1 is not limited to this. The flexible display panel 1 is, for example, an active-matrix display panel. The flexible display panel 1 includes a plurality of pixels arranged in a matrix, and light emission of the plurality of pixels is controlled by a circuit board module. The shape of the flexible display panel 1 in plan view is, for example, a rectangular shape. However, the shape is not limited to this.

The flexible display panel 1 includes a display portion 60 (pixel portion) for display and a terminal portion 50 (wiring portion) around the display portion 60. The terminal portion 50 is a dense part of power supply wires and signal wires (data lines and scan lines) drawn out from the display portion 60, and the terminal portion 50 is used for establishing, for example, electrical connection to an external circuit board module of the flexible display panel 1. The terminal portion 50 is formed around the display portion 60. Wires (for example, see wires 21 illustrated in FIG. 5) are exposed in the terminal portion 50. The display portion 60 includes a plurality of pixels. The display portion 60 includes a plurality of pixels that emit red (R) light, a plurality of pixels that emit green (G) light, and a plurality of pixels that emit blue (B) light (pixel circuits), and the plurality of pixels are arranged in a matrix. The pixel includes a pixel circuit including a thin film transistor (TFT). The display portion 60 includes power supply wires for supplying drive current to the pixels, scan lines that are signal wires corresponding to the row direction of the pixels, and data lines that are signal wires corresponding to the column direction of the pixels.

Each of the display portion 60 and the terminal portion 50 includes the flexible substrate 10 including a first main surface 10a described later and a second main surface 10b on the opposite side of the first main surface 10a, the flexible substrate 10 containing resin; and the wiring layer 20 formed on the first main surface 10a of the flexible substrate 10.

The flexible substrate 10 is a flexible transmissive substrate. The flexible substrate 10 is a sheet-shaped substrate. The flexible substrate 10 contains a transmissive resin and contains, for example, one of polyimide (PI), polyethylene terephthalate (PET), polycarbonate (PC), and polyethylene naphthalate (PEN).

The terminal portion 50 and the display portion 60 are formed on the flexible substrate 10. The flexible substrate 10 has, for example, a rectangular shape. However, the shape is not limited to this.

The flexible substrate 10 includes the first main surface 10a that is a main surface on the display surface side (Z-axis positive side) and the second main surface 10b that is a main surface on the opposite side of the display surface. The second main surface 10b is a main surface trailing the first main surface 10a. The thickness of the flexible substrate 10 (length in Z-axis direction) is, for example, equal to or greater than 5 µm but equal to or smaller than 50 µm. However, the thickness is not limited to this.

The wiring layer 20 is a layer formed on the first main surface 10a of the flexible substrate 10 and provided with various wires for the flexible display panel 1 to control the light emitting pixels. The wiring layer 20 is formed across both the terminal portion 50 and the display portion 60. The power supply wires and the signal wires are formed in the wiring layer 20. The thickness of the wiring layer 20 (length in Z-axis direction) is, for example, equal to or greater than 0.1 µm and equal to or smaller than 5 µm. However, the thickness is not limited to this.

Note that a barrier inorganic insulating layer (what is generally called an undercoat layer) provided to prevent such a substance as sodium ion from moving from the flexible substrate 10 to an upper layer (for example, a semiconductor layer not illustrated) is formed between the flexible substrate 10 and the wiring layer 20. The inorganic insulating layer includes, for example, a silicon nitride layer and a silicon oxide layer, and the silicon nitride layer and the silicon oxide layer are stacked in this order from the flexible substrate 10 side. The silicon nitride layer includes, for example, a silicon nitride film, and has a thickness of approximately 50 nm. The silicon oxide layer includes, for example, a silicon oxide film, and has a thickness of approximately 100 nm.

The first protection layer 30 is a transmissive resin layer formed on the wiring layer 20 and designed to protect the wiring layer 20. The first protection layer 30 covers part of the flexible substrate 10. The first protection layer 30 covers the display portion 60.

The second protection layer 40 is a transmissive resin layer formed on the second main surface 10b (Z-axis negative side) of the flexible substrate 10 and designed to protect the flexible substrate 10. The second protection layer 40 covers the flexible substrate 10. The second protection layer 40 covers both the terminal portion 50 and the display portion 60 on the second main surface 10b side of the flexible substrate 10. The thickness of the second protection layer 40 (length in Z-axis direction) is, for example, equal to or greater than 10 µm but equal to or smaller than 1000 µm. However, the thickness is not limited to this.

The first protection layer 30 and the second protection layer 40 are sheet-shaped members. The first protection layer 30 and the second protection layer 40 contain a transmissive resin. The first protection layer 30 and the second protection layer 40 contain, for example, one of polyethylene terephthalate (PET), polyimide (PI), polycarbonate (PC), and polyethylene naphthalate (PEN).

The terminal portion 50 of the flexible display panel 1 will be described here. The flexible display panel 1 according to the present embodiment includes an inclined surface 51 on the terminal portion 50. The inclined surface 51 is inclined toward the center (Y-axis positive side) of the flexible display panel 1 from the second main surface 10b side to the first main surface 10a side (from the Z-axis negative side to the Z-axis positive side). It can also be stated that the inclined surface 51 is inclined in the direction from the terminal portion 50 to the display portion 60, from the second main surface 10b side to the first main surface 10a side.

In the present embodiment, the inclined surface 51 includes the second protection layer 40, the flexible substrate 10, and the wiring layer 20. In other words, each of the second protection layer 40, the flexible substrate 10, and the wiring layer 20 is inclined toward the center of the flexible display panel 1 from the second main surface 10b side to the first main surface 10a side. The inclined surface 51 is a laser cut surface formed by using laser light to integrally cut the second protection layer 40, the flexible substrate 10, and the wiring layer 20. The inclined surface 51 is a surface continuously provided from the second protection layer 40 to the wiring layer 20. The inclined surface 51 is extended throughout the X-axis direction of the flexible display panel 1.

A width L (recess length) of the inclined surface 51 in plan view of the flexible display panel 1 is equal to or greater than 5.7 μm. Preferably, the width L is equal to or greater than 13.1 μm, and more preferably, the width L is equal to or greater than 14.6 μm. The width L can be equal to or smaller than 46.7 μm from the viewpoint of reducing the adhesion of dirt during the laser cut of the inclined surface 51. Note that verification results regarding the width L will be described later.

Note that the width L of the inclined surface 51 is, for example, a length calculated in reference to the wiring layer 20 and the second protection layer 40 in the example of FIG. 1. The width L of the inclined surface 51 is, for example, a direct distance in the Y-axis direction between an end of the wiring layer 20 on the Z-axis positive side and an end of the second protection layer 40 on the Z-axis negative side.

An angle θ between the inclined surface 51 and the first main surface 10a or the second main surface 10b is smaller than 88 degrees. In the present embodiment, the angle θ between the inclined surface 51 and a surface on the back side of the second protection layer 40 (surface on Z-axis negative side) is smaller than 88 degrees. Preferably, the angle θ is equal to or smaller than 86 degrees, and more preferably, the angle θ is equal to or smaller than 82 degrees. The angle θ may be equal to or smaller than 81 degrees. The angle θ may be calculated by using, for example, the following Equation 1.

$$\cos \theta = \text{width } L/\text{length of inclined surface 51} \quad \text{(Equation 1)}$$

Note that the length of the inclined surface 51 is, for example, a length calculated in reference to the wiring layer 20 and the second protection layer 40 in the example of FIG. 1. The length of the inclined surface 51 is, for example, the direct distance between the end of the wiring layer 20 on the Z-axis positive side and the end of the second protection layer 40 on the Z-axis negative side.

It is sufficient that the flexible display panel 1 satisfy the condition of, for example, at least one of the width L and the angle θ. The flexible display panel 1 may satisfy the condition of, for example, at least the width L.

It is sufficient that the flexible display panel 1 include at least the flexible substrate 10 and the wiring layer 20. That is, it is sufficient that the inclined surface 51 be formed to include at least the flexible substrate 10 and the wiring layer 20.

As described above, the flexible display panel 1 is a flexible display panel including the display portion 60 for display (for example, the display portion 60 including a plurality of pixels) and the terminal portion 50 around the display portion 60. Each of the display portion 60 and the terminal portion 50 includes the flexible substrate 10 including the first main surface 10a and the second main surface 10b on the opposite side of the first main surface 10a, the flexible substrate 10 containing resin; and the wiring layer 20 formed on the first main surface 10a of the flexible substrate 10. The terminal portion 50 includes the inclined surface 51 inclined toward the display portion 60 from the second main surface 10b side to the first main surface 10a side. The width L of the inclined surface 51 in plan view of the flexible display panel 1 (the width L in the direction (Y-axis direction) between the terminal portion 50 and the display portion 60) is equal to or greater than 13.1 μm.

As described above, the flexible display panel 1 includes the flexible substrate 10 including the first main surface 10a and the second main surface 10b on the back side of the first main surface 10a, the flexible substrate 10 containing resin; and the wiring layer 20 formed on the first main surface 10a of the flexible substrate 10. The flexible display panel 1 includes the display portion 60 and the terminal portion 50 around the display portion 60, each of the display portion 60 and the terminal portion 50 being formed to include the flexible substrate 10 and the wiring layer 20. It can also be stated that the terminal portion 50 including the flexible substrate 10 and the wiring layer 20 includes the inclined surface 51 inclined toward the center of the flexible display panel 1 from the second main surface 10b side to the first main surface 10a side, and the width L of the inclined surface 51 in plan view of the flexible display panel 1 is equal to or greater than 13.1 μm.

2. Manufacturing Method of Flexible Display Panel

Figure 2:
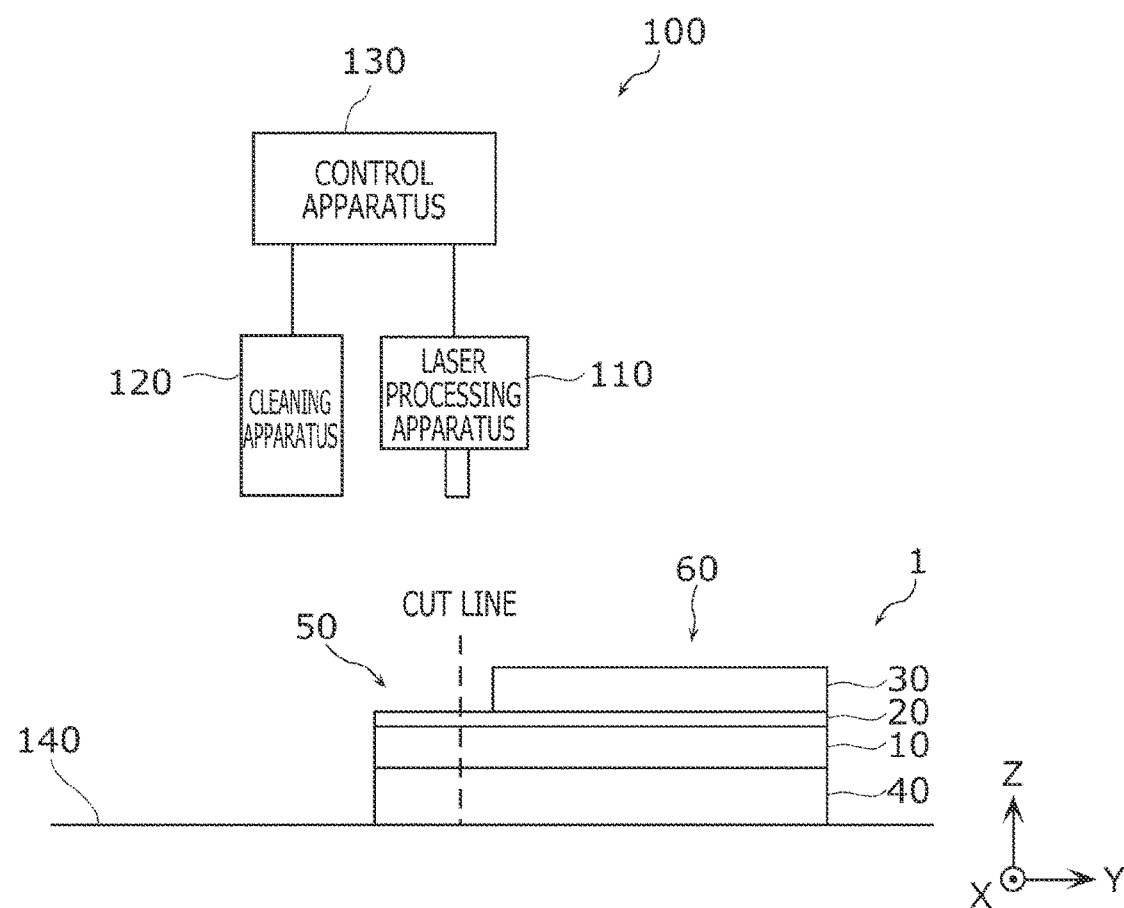
FIG. 2 is a schematic diagram illustrating a schematic configuration of a manufacturing system for manufacturing the flexible display panel according to the embodiment.

Next, a manufacturing method of the flexible display panel 1 will be described with reference to FIGS. 2 to 7. First, a manufacturing system for manufacturing the flexible display panel 1 will be described with reference to FIG. 2. FIG. 2 is a schematic diagram illustrating a schematic configuration of a manufacturing system 100 that manufactures the flexible display panel 1 according to the present embodiment. FIG. 2 illustrates only a step of laser cutting the terminal portion 50 of the flexible display panel 1.

Note that a wire and a pad used in normal operation, a test circuit used in lighting inspection, and other components are formed on the terminal portion 50. The test circuit includes, for example, a pad for lighting inspection (hereinafter, also referred to as an "inspection pad") and a plurality of electro static discharge (ESD) wires for lighting inspection. The ESD wires are wires for discharging static electricity. The inspection pad is a pad used in inspection during manufacturing including lighting inspection, and the inspection pad is a dedicated pad. The manufacturing system 100 is a system for cutting the test circuit.

As illustrated in FIG. 2, the manufacturing system 100 includes a laser processing apparatus 110, a cleaning apparatus 120, a control apparatus 130, and a movement apparatus 140.

The laser processing apparatus 110 is an apparatus that uses a laser to process the flexible display panel 1 (example of stacked body) in which the terminal portion 50 is not cut. The laser processing apparatus 110 is an apparatus that laser cuts part of the terminal portion 50. The laser processing apparatus 110 laser cuts a cut line of the terminal portion 50. The laser processing apparatus 110 includes a laser oscillator and a processing head.

The laser oscillator is, for example, an yttrium aluminum garnet (YAG) laser oscillator (oscillation wavelength of 1064 nm, 355 nm, etc.), a femtosecond laser oscillator (oscillation wavelength of 780 nm), or a picosecond laser oscillator (oscillation wavelength of 1040 nm). The laser oscillator outputs a laser toward an optical component of a processing head. Examples of the laser include two types of lasers including a processing laser and a pre-shot laser different from the processing laser. The processing laser is a laser for actually processing the flexible display panel 1. The pre-shot laser is a laser for adjusting the focus position of the processing laser, and the pre-shot laser is applied to the flexible display panel 1 before the processing laser is applied to the flexible display panel 1. The optical axis of the processing laser and the optical axis of the pre-shot laser coincide with each other. The wavelength of the processing laser and the wavelength of the pre-shot laser are, for example, the same.

The processing head includes such optical members as a collimating lens, a reflection mirror (total reflection mirror), and a condenser lens.

Although the laser processing apparatus 110 uses a solid-state laser, such as a YAG laser, the laser is not limited to this. The laser processing apparatus 110 may use a gas laser in 10 μm band, such as a $CO_2$ laser, or a fiber laser.

The laser processing apparatus 110 may further include, for example, a movement unit that can move the processing head in the Z-axis direction (focus direction).

The cleaning apparatus 120 cleans the inclined surface 51 cut by the laser processing apparatus 110. The cleaning apparatus 120 dry cleans the inclined surface 51. The cleaning apparatus 120 sprays a cleaning gas containing fine particles on the inclined surface 51 to clean the inclined surface 51. The fine particles are, for example, dry ice snow ($CO_2$ snow), and the cleaning gas may contain, for example, a carbon dioxide gas. That is, the cleaning apparatus 120 may be a dry ice snow cleaning apparatus.

The dry ice snow contains dry ice fine particles generated from a liquefied carbon dioxide gas. The dry ice snow cleaning apparatus crashes, at high speed, the dry ice snow into an object to be cleaned (for example, inclined surface 51), to remove the particles or organic matters (for example, carbide) attached to the object to be cleaned. Although the particle size of the dry ice snow is, for example, equal to or greater than 10 μm but equal to or smaller than 200 μm, the particle size is not limited to this. Although the particle size is an average particle size, the particle size may be a maximum particle size, a minimum particle size, or a median of particle sizes. Although the crash pressure of the dry ice snow is, for example, approximately 5 MPa, the crash pressure is not limited to this. Although the discharge pressure (spray gas pressure) of the dry ice snow is approximately 0.5 MPa and the discharge time is approximately 60 seconds, the discharge pressure and the discharge time are not limited to these.

The cleaning apparatus 120 includes, for example, a mixing unit that mixes a carbon dioxide gas containing dry ice snow with a spray gas to generate a mixed gas; and a nozzle that sprays the mixed gas.

Note that the cleaning method of the cleaning apparatus 120 is not limited to the method of using dry ice snow, and the cleaning method may be, for example, ion milling or $O_2$ asking.

Note that the cleaning apparatus 120 does not perform wet cleaning using, for example, an organic solvent.

The control apparatus 130 controls each constituent element of the manufacturing system 100. The control apparatus 130 controls, for example, the laser processing apparatus 110 to control, for example, the output power of the laser and the focal length. The control apparatus 130 controls, for example, the cleaning apparatus 120 to control, for example, the crash pressure and the discharge time. The control apparatus 130 controls, for example, the movement apparatus 140 to move the flexible display panel 1 in, for example, the Y-axis direction and the Z-axis direction.

The movement apparatus 140 supports and moves the flexible display panel 1. The movement apparatus 140 can move (convey), for example, the flexible display panel 1 in the Y-axis direction (from upstream to downstream in the step). The movement apparatus 140 may be able to move, for example, the flexible display panel 1 in the Z-axis direction (focus direction). The movement apparatus 140 includes, for example, an actuator, a motor, and other components.

Figure 3:
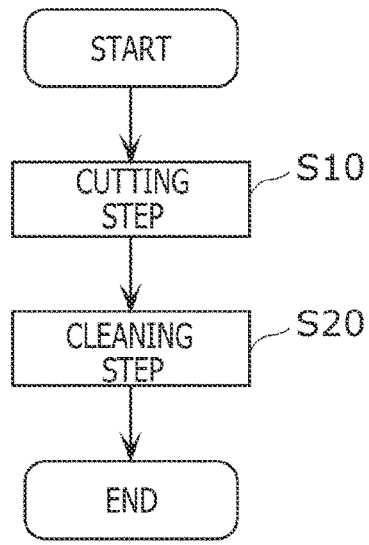
FIG. 3 is a flow chart illustrating a manufacturing method of the flexible display panel according to the embodiment.
Figure 4:
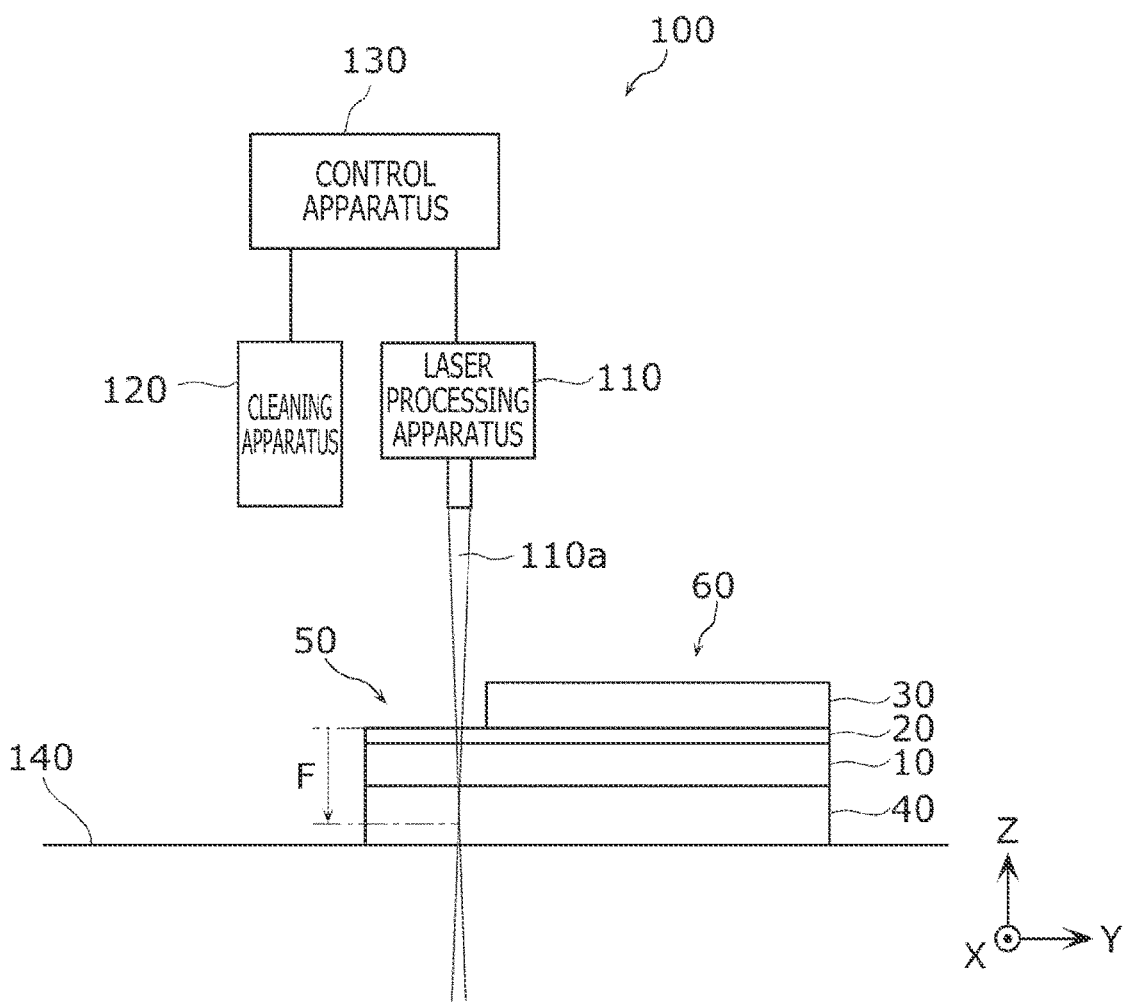
FIG. 4 is a schematic diagram illustrating a cutting step according to the embodiment.

Next, a manufacturing method of the flexible display panel 1 will be described with reference to FIGS. 3 to 7. FIG. 3 is a flow chart illustrating the manufacturing method of the flexible display panel 1 according to the present embodiment. FIG. 4 is a schematic diagram illustrating a cutting step (S10) according to the present embodiment.

As illustrated in FIG. 3, the manufacturing method of the flexible display panel 1 includes the cutting step (S10) and a cleaning step (S20).

In the cutting step, a laser is used to cut the terminal portion 50 of the stacked body of the flexible substrate 10 and the wiring layer 20 such that the terminal portion 50 has a slope toward the center of the flexible display panel 1 (toward the center in plan view) from the second main surface 10b side to the first main surface 10a side.

As illustrated in FIG. 4, the control apparatus 130 in the cutting step controls the movement apparatus 140 to move the terminal portion 50 of the flexible display panel 1 to the position for laser cut and controls the laser processing apparatus 110 to emit a laser 110a. The second protection layer 40, the flexible substrate 10, and the wiring layer 20 are integrally cut in the cutting step.

The focus of the laser processing apparatus 110 is not on the surface (for example, wiring layer 20) of the terminal portion 50. In other words, the laser processing apparatus 110 performs the laser cut in a defocused state. The control apparatus 130 may control at least one of the movement unit of the laser processing apparatus 110 and the movement apparatus 140 to move the terminal portion 50 to a defocus position that is defocused or may control the optical component of the laser processing apparatus 110 to change the focal length such that the terminal portion 50 is put into the defocused state.

In the cutting step, the surface of the flexible display panel 1 (example of stacked body) in which the terminal portion 50 is not cut is arranged on the defocus position on the emission side (Z-axis positive side) of the laser 110a with respect to the focus position of the laser 110a, and the laser 110a is used to cut the terminal portion 50 in this state. For example, in the cutting step, the terminal portion 50 is cut after being moved to a position (example of defocus position) on the laser processing apparatus 110 side (Z-axis positive side) while the laser 110a is focused on (focal point is on) the surface of the terminal portion 50. In other words, the laser 110a is focused on a position on the Z-axis negative side with respect to the surface of the terminal portion 50 during the cut. A length F from the surface of the terminal portion 50 to the focused position of the laser 110a in the Z-axis direction may be, for example, equal to or smaller than the thickness of the terminal portion 50 (length in Z-axis direction) or may be longer than the thickness of the terminal portion 50.

Although the focus position is shifted below (in the Z-axis negative side of) the wiring layer 20 in the description above, shifting the focus position above (in the Z-axis positive side of) the wiring layer 20 is also effective in forming the inclined surface 51. For example, in the cutting step, the surface of the flexible display panel 1 in which the terminal portion 50 is not cut may be arranged on a defocus position on the second protection layer 40 side (Z-axis negative side) with respect to the focus position of the laser 110a, and the laser 110a may be used to cut the terminal portion 50 in this state. For example, in the cutting step, the terminal portion 50 may be cut after being moved to a position (example of defocus position) on the second protection layer 40 side (Z-axis negative side) while the laser 110a is focused on the surface of the terminal portion 50. In other words, the laser 110a may be focused on a position on the Z-axis positive side with respect to the surface of the terminal portion 50 during the cut. Performing laser cutting in a state in which the defocus amount is adjusted as described above makes it possible to cause the cut surface of the flexible display panel 1 to be the desired inclined surface 51.

Note that the first protection layer 30 is not laser cut in the cutting step.

Figure 5:
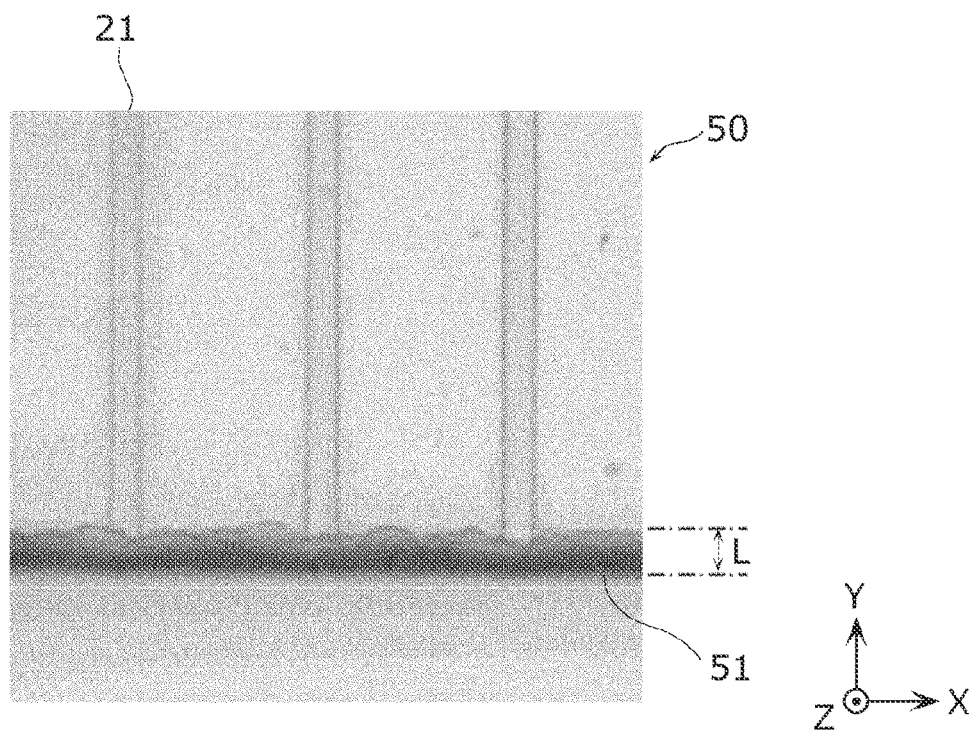
FIG. 5 depicts a terminal portion according to the embodiment.
Figure 6:
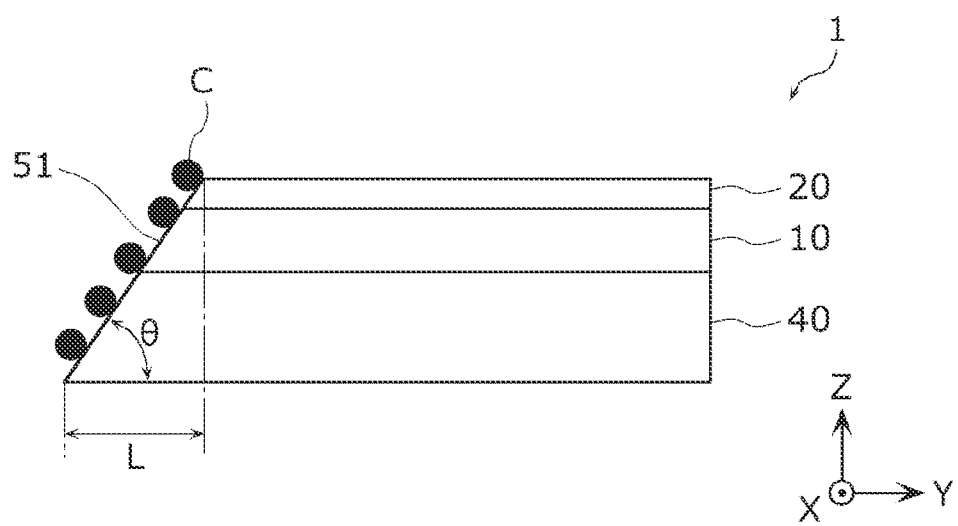
FIG. 6 is a schematic diagram illustrating a cut surface obtained after cut processing according to the embodiment.

The flexible display panel 1 in which the terminal portion 50 is cut by the laser processing apparatus 110 will be described with reference to FIGS. 5 and 6. FIG. 5 depicts the terminal portion 50 according to the present embodiment. FIG. 6 is a schematic diagram illustrating the cut surface (inclined surface 51) obtained after the cut processing according to the present embodiment. Note that FIG. 5 illustrates the state of the terminal portion 50 obtained after the cleaning step. FIG. 5 is an enlarged photograph of a microscope.

As illustrated in FIG. 5, the inclined surface 51 has the width L, and is provided along the X-axis direction. The width L is, for example, an average value of the width of the inclined surface 51 provided along the X-axis direction. However, the width L may be a maximum value, a minimum value, a mode, a median, or other value. Note that the wires 21 are formed on the terminal portion 50.

As illustrated in FIG. 6, carbide C is formed on the inclined surface 51 (cut end surface) after the laser cut. The flexible substrate 10 containing resin is laser cut, and the resin is altered to form the carbide C. The carbide C is, for example, formed to cover the inclined surface 51. The resistance between the wires 21 of the terminal portion 50 is reduced through the carbide C formed on the inclined surface 51, and therefore, the contact of the wires 21 and the carbide C needs to be suppressed. Hence, the cleaning step is executed after the cutting step.

In the cleaning step described in FIG. 3, the inclined surface 51 formed in the cutting step is dry cleaned. For example, the cleaning step is sequentially executed after the cutting step.

Figure 7:
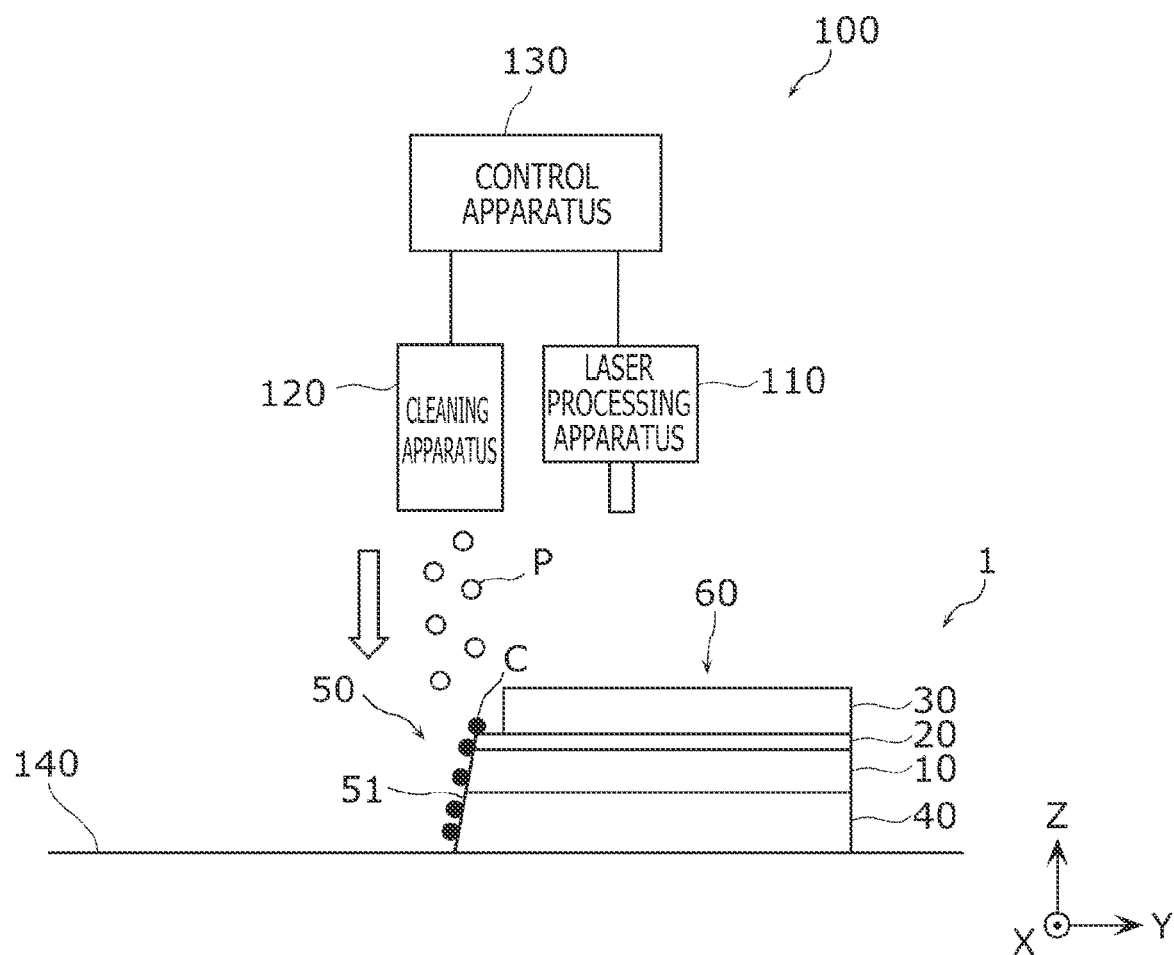
FIG. 7 is a schematic diagram illustrating a cleaning step according to the embodiment.

FIG. 7 is a schematic diagram illustrating the cleaning step according to the present embodiment.

As illustrated in FIG. 7, the control apparatus 130 in the cleaning step controls the movement apparatus 140 to move the terminal portion 50 of the flexible display panel 1 to a position for cleaning and controls the cleaning apparatus 120 to emit a cleaning gas containing fine particles P. The cleaning step is a step for removing the carbide C formed on the inclined surface 51.

As also described above, an inorganic insulating layer is formed between the flexible substrate 10 and the wiring layer 20. The inorganic insulating layer is not cut by the laser 110a in the cutting step. Thus, the cleaning is performed while the inorganic insulating layer still remains. In this case, the inorganic insulating layer protrudes to the Y-axis negative side, and the fine particles P for cleaning are shielded. Thus, the fine particles P may not reach the part on the Z-axis negative side with respect to the inorganic insulating layer, and the cleaning may not be sufficiently performed.

In the present embodiment, the inclined surface 51 has the width L equal to or greater than 13.1 μm, or the angle θ equal to or smaller than 86 degrees. As a result, the extension length of the inorganic insulating layer can be longer than that when the terminal portion 50 is cut in parallel to the Z-axis. Therefore, large moment is applied to the inorganic insulating layer when the fine particles P crash into the inorganic insulating layer, and the inorganic insulating layer is easily cracked and taken off due to the crash of the fine particles P. As the inorganic insulating layer is removed, the fine particles P can be crashed into the entire inclined surface 51, and a sufficient cleaning effect can be obtained.

3. Evaluation Results

Figure 8:
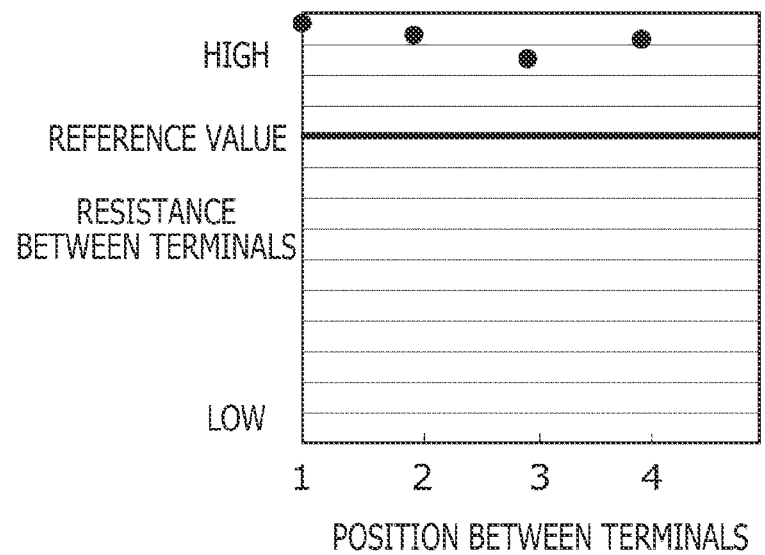
FIG. 8 depicts measurement results regarding resistance between terminals when a taper angle is 85 degrees according to the embodiment.
Figure 9:
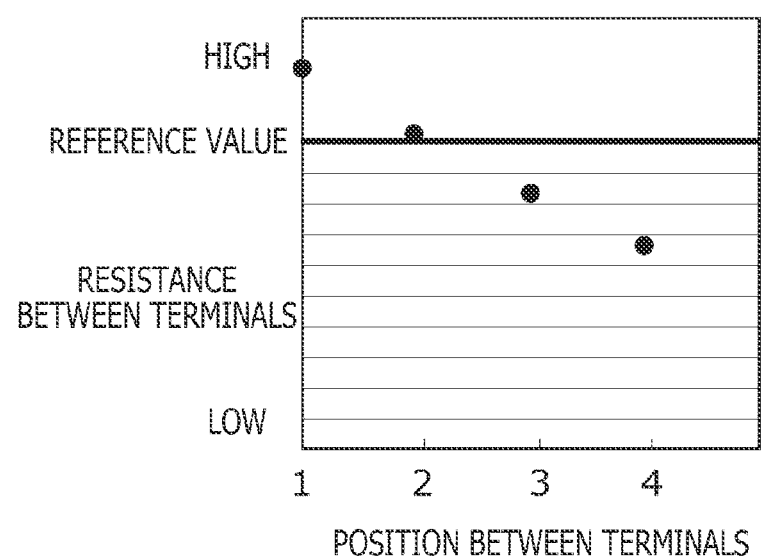
FIG. 9 depicts measurement results regarding resistance between terminals when the taper angle is 88 degrees according to a comparison example.

Next, evaluation results regarding the flexible substrate 10 manufactured by the manufacturing method will be described with reference to FIGS. 8 to 11. First, the resistance between terminals (resistance between wires 21) of the terminal portion 50 based on the angle θ of the inclined surface 51 will be described with reference to FIGS. 8 and 9. FIG. 8 depicts measurement results regarding the resistance between terminals when the taper angle is 85 degrees according to the present embodiment. FIG. 9 depicts measurement results regarding the resistance between terminals when the taper angle is 88 degrees according to a comparison example. Note that a high resistance between terminals means that the cleaning is appropriately performed by the cleaning apparatus 120, that is, the carbide C is removed by cleaning.

In FIGS. 8 and 9, the vertical axis represents the resistance between terminals, and the horizontal axis represents the position between terminals. The reference value is a lower limit of the resistance between terminals.

As illustrated in FIG. 8, the resistance between terminals when the taper angle (angle θ) is 85 degrees is equal to or greater than the reference value at all four points, and a high resistance is maintained between the terminals.

As illustrated in FIG. 9, the resistance between terminals when the taper angle (angle θ) is 88 degrees is equal to or greater than the reference value at some positions but smaller than the reference value at other positions. That is, the resistance between terminals is not stable, and the resistance is reduced. Therefore, it is desirable that the angle θ be equal to or smaller than 85 degrees.

Figure 10:
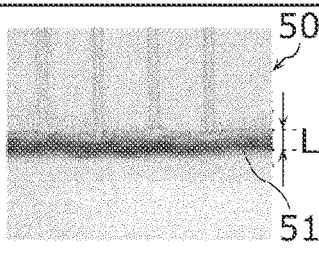
FIG. 10 depicts a relation between laser conditions and a terminal state according to the embodiment.
Figure 10:
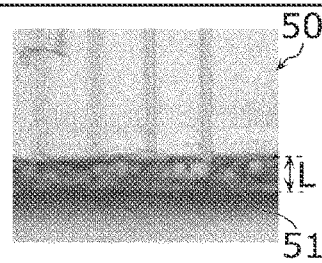
Figure 10:
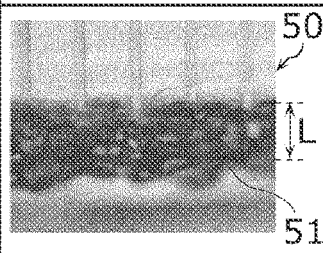

FIG. 10 depicts a relation between the laser conditions and the terminal state according to the present embodiment. In FIG. 10, the power of the laser 110a is 10 W, the scan is at 10 or 30 cycles, and the focus (length F) is at 0 mm, −2.0 mm, or −4.0 mm. Note that the focus denotes a length in the Z-axis negative direction from the wiring layer 20. For example, −2.0 mm indicates that the focus position of the laser 110a is at a position of 2.0 mm in the Z-axis negative direction from the wiring layer 20. The focus at 0 mm means that the focal point of the laser 110a is on the surface of the wiring layer 20.

As illustrated in FIG. 10, the longer the focus, the longer the width L of the inclined surface 51 of the terminal portion 50 tends to be. The longer the width L, the longer the extension length of protrusion of the inorganic insulating layer during the cut. Hence, the protruding inorganic insulating layer can more easily be removed. For this reason, it is preferable that the focus be long. The focus is preferably, for example, equal to or greater than 0 mm.

FIG. 11 depicts a relation between the laser conditions, the focus, and the resistance between terminals according to the present embodiment. In FIG. 11, "OK" indicates that the resistance between terminals satisfies the reference value, and "NG" indicates that the resistance between terminals does not satisfy the reference value.

As illustrated in FIG. 11, the resistance between terminals is "NG" and does not satisfy the reference value when the laser power is 1.7 W, the scan is at 18 scans (18 cycles), and the focus is at +0.2 mm (length F=+0.2 mm). The resistance between terminals is "OK" and satisfies the reference value when the laser power is 3.0 W, the scan is at 10 scans, and the focus is at 0 mm (length F=0 mm). The longer the focus (the larger the negative value) or the higher the laser power, the higher the resistance between terminals tends to be. Accordingly, the resistance between terminals can be "OK" when, for example, the conditions are in an area with dashed lines.

Consequently, it is preferable that the output power of the laser 110a be equal to or greater than 3 W but equal to or smaller than 10 W and the focus (length F between the focus position and the surface of the wiring layer 20) be equal to or greater than −2.0 mm but equal to or smaller than 0 mm. It can also be stated that the length F between the focus position and the surface of the terminal portion 50 is a length equal to or greater than 0 mm but equal to or smaller than 2.0 mm toward the second main surface 10b from the surface.

FIG. 12 depicts verification results regarding the recess length and the resistance value determination results according to the present embodiment. FIG. 12 illustrates determination results regarding the width L (recess length) of the inclined surface 51 and the resistance value (resistance between terminals).

As illustrated in FIG. 12, the resistance value determination result is NG when the width L is 6.8 μm, and the resistance value determination result is OK when the width L is equal to or greater than 13.1 μm. Thus, it is preferable that the width L be equal to or greater than 13.1 μm, and it is more preferable that the width L be equal to or greater than 14.6 μm.

The laser conditions when the width L is 6.8 μm include the laser power of 3 W and the focus of −0.5 mm (length F=−0.5 mm). The laser conditions when the width L is 13.4 μm include the laser power of 3 W and the focus of 0 mm (length F=0 mm). The laser conditions when the width L is 14.6 μm include the laser power of 5 W and the focus of −0.5 mm (length F=−0.5 mm). The laser conditions when the width L is 19.8 μm include the laser power of 5 W and the focus of −1.0 mm (length F=−1.0 mm). The laser conditions when the width L is 24.7 μm include the laser power of 10 W and the focus of 0 mm (length F=0 mm). The laser conditions when the width L is 46.7 μm include the laser power of 10 W and the focus of −2.0 mm (length F=−2.0 mm).

Although the resistance value result is NG when the width L is 6.8 μm in the results of FIG. 12, the rise in the resistance value can be suppressed compared to when the width L is 0 mm. The rise in the resistance value can be suppressed even when the width L is equal to or smaller than, for example, 6.8 μm, depending on the cleaning conditions. Even when the width L is, for example, 5.7 μm, the rise in the resistance value can be suppressed compared to when the width L is 0 mm. The cleaning conditions include such conditions as discharge pressure and discharge time of dry ice snow.

4. Effects, Etc.

As described above, the flexible display panel 1 according to the present embodiment includes the display portion 60 for display and the terminal portion 50 around the display portion 60. Each of the display portion 60 and the terminal portion 50 includes the flexible substrate 10 including the first main surface 10a and the second main surface 10b on the opposite side of the first main surface 10a, the flexible substrate 10 containing resin; and the wiring layer 20 formed on the first main surface 10a of the flexible substrate 10. The terminal portion 50 includes the inclined surface 51 inclined toward the display portion 60 from the second main surface 10b side to the first main surface 10a side, and the width L of the inclined surface 51 in plan view of the flexible display panel 1 is equal to or greater than 13.1 μm.

In this way, the flexible display panel 1 includes the inclined surface 51 with the width L equal to or greater than 13.1 μm, and the carbide C generated by laser cut can be removed in the cleaning step even when the inclined surface 51 is formed by laser cut. Thus, the flexible display panel 1 according to a mode of the present disclosure can prevent the carbide C from being left on the cut end surface when the laser cut is performed.

The width L of the inclined surface 51 may be equal to or greater than 14.6 μm.

In this way, the carbide C generated by the laser cut can be removed more.

The width L of the inclined surface 51 may be equal to or smaller than 46.7 μm.

This can suppress the adhesion of dirt on the inclined surface 51 obtained after the laser cut.

The angle θ between the second main surface 10b and the inclined surface 51 may be equal to or smaller than 86 degrees.

In this way, the carbide C generated by the laser cut can be further removed.

The flexible display panel 1 includes the second protection layer 40 (example of protection layer) that covers the display portion 60 and the terminal portion 50 of the flexible display panel 1 on the second main surface 10b side of the flexible substrate 10. The inclined surface 51 is formed to also include the second protection layer 40.

This can prevent the carbide C from being left on the part of the inclined surface 51 in the second protection layer 40 when the flexible display panel 1 includes the second protection layer 40.

The flexible display panel 1 is an organic EL panel.

This can suppress the adhesion of the carbide C on the inclined surface 51 of the terminal portion 50 of the organic EL panel (flexible organic EL panel).

As described above, the manufacturing method of the flexible display panel 1 according to the present embodiment is a manufacturing method of the flexible display panel 1 including the display portion 60 for display and the terminal portion 50 around the display portion 60. Each of the display portion 60 and the terminal portion 50 includes the flexible substrate 10 including the first main surface 10a and the second main surface 10b on the opposite side of the first main surface 10a, the flexible substrate 10 containing resin; and the wiring layer 20 formed on the first main surface 10a of the flexible substrate 10. The manufacturing method includes the cutting step (S10) of using the laser to cut the terminal portion 50 such that the terminal portion 50 has a slope toward the display portion 60 from the second main surface 10b side to the first main surface 10a side; and the cleaning step (S20) of dry cleaning the inclined surface 51 formed in the cutting step, in which the width L of the inclined surface 51 formed in the cutting step is equal to or greater than 13.1 µm in plan view of the flexible display panel 1.

In this way, the inclined surface 51 of the flexible display panel 1 with the width L equal to or greater than 13.1 µm is formed by the laser cut in the cutting step, and the carbide C generated by the laser cut can be removed more in the cleaning step than in wet cleaning. Thus, the manufacturing method of the flexible display panel 1 according to a mode of the present disclosure can prevent the carbide C from being left on the cut end surface (inclined surface 51) when the laser cut is performed.

In the cutting step, the surface of the terminal portion 50 is arranged on the defocus position shifted from the focus position of the laser 110a, and the laser 110a is used to cut the surface in this state.

In this way, the inclined surface 51 can easily be formed by simply arranging the terminal portion 50 on the defocus position.

The output power of the laser 110a is equal to or greater than 3 W but equal to or smaller than 10 W, and the length F between the focus position and the surface of the terminal portion 50 is a length equal to or greater than 0 mm but equal to or smaller than 2.0 mm toward the second main surface 10b side from the surface.

This can realize the flexible display panel 1 in which the reduction in the resistance between terminals of the terminal portion 50 is suppressed, that is, the flexible display panel 1 in which the carbide C can be removed more from the inclined surface 51.

In the cleaning step, the cleaning gas containing the fine particles P is sprayed on the inclined surface 51.

In this way, the fine particles P can be crashed into the carbide C to efficiently clean the inclined surface 51.

The fine particles P are dry ice snow, and the cleaning gas contains a carbon dioxide gas.

In this way, the inclined surface 51 can be cleaned at low cost. Liquid is not left on the inclined surface 51 after the cleaning. Thus, a drying step is not necessary after the cleaning, and the manufacturing step can be simplified.

Other Embodiments

Although the flexible display panel according to the present disclosure has been described in reference to the embodiment, the flexible display panel according to the present disclosure is not limited to the embodiment. Other embodiments realized by combining any constituent elements in the embodiment, modifications obtained by modifying the embodiment in various ways conceived of by those skilled in the art without departing from the scope of the present disclosure, and various devices including the flexible display panel according to the present embodiment are also included in the present disclosure.

For example, the present disclosure may be realized as a flexible display apparatus including the flexible display panel according to, for example, the embodiment and a circuit board module that drives the flexible display panel.

The flexible display panel is an organic EL panel in the example described in the embodiment. However, the flexible display panel is not limited to this, and the flexible display panel may be, for example, a liquid crystal display (LCD) panel.

The method of communication between apparatuses included in the manufacturing system of the embodiment is not particularly limited to any kind. The communication method may be wireless communication, wired communication, or a combination of the wireless communication and the wired communication.

The order of a plurality of processes described in, for example, the embodiment is an example. The order of the plurality of processes may be changed, or the plurality of processes may be executed in parallel. Part of the plurality of processes may not be executed.

The steps in the manufacturing method described in the embodiment may be executed in one step or may be executed in separate steps. Note that the execution in one step includes execution of the steps with use of one apparatus, continuous execution of the steps, or execution of the steps at the same place. The execution in separate steps includes execution of the steps with use of separate apparatuses, execution of the steps at different times (for example, different days), or execution of the steps at different places.

In the embodiment, for example, the constituent elements may be included in dedicated hardware or may be realized by execution of a software program suitable for the constituent elements. A program execution unit, such as a processor, may read and execute a software program recorded in a recording medium, such as a hard disk and a semiconductor memory, to realize the constituent elements (for example, control apparatus and other units). The processor includes one or a plurality of electronic circuits including a semiconductor integrated circuit (IC) and large scale integration (LSI). The plurality of electronic circuits may be integrated into one chip or may be provided on a plurality of chips. The plurality of chips may be integrated into one apparatus or may be included in a plurality of apparatuses.

At least one of the apparatuses may be a computer system specifically including, for example, a microprocessor, a read only memory (ROM), a random access memory (RAM), a hard disk unit, a display unit, a keyboard, and a mouse. A computer program is stored in the RAM or the hard disk unit. The microprocessor operates according to the computer program, and the at least one of the apparatuses attains the function of the apparatus. To attain a predetermined function, the computer program includes a combination of a plurality of instruction codes representing commands to the computer.

The present disclosure can be widely used in flexible display panels.

What is claimed is:

1. A flexible display panel, comprising:
a display portion for display; and
a terminal portion around the display portion, wherein
each of the display portion and the terminal portion includes:
a flexible substrate including a first main surface and a second main surface on an opposite side of the first main surface, the flexible substrate containing a resin, and
a wiring layer on the first main surface of the flexible substrate,
the terminal portion includes an inclined surface inclined toward the display portion from a side of the second main surface to a side of the first main surface, and
a width of the inclined surface in plan view of the flexible display panel is equal to or greater than 13.1 µm and equal to or smaller than 167 µm.

2. The flexible display panel according to claim 1, wherein the width of the inclined surface is equal to or greater than 14.6 µm and equal to or smaller than 167 µm.

3. The flexible display panel according to claim 1, wherein the width of the inclined surface is equal to or smaller than 46.7 µm.

4. The flexible display panel according to claim 1, wherein an angle between the second main surface and the inclined surface is equal to or smaller than 86 degrees.

5. The flexible display panel according to claim 1, further comprising a protection layer that covers the display portion and the terminal portion of the flexible display panel on the side of the second main surface of the flexible substrate, wherein the inclined surface includes the protection layer.

6. The flexible display panel according to claim 1, wherein the flexible display panel is an organic electro luminescence panel.

7. A manufacturing method of a flexible display panel including a display portion for display and a terminal portion around the display portion, each of the display portion and the terminal portion including a flexible substrate, the flexible substrate including a first main surface and a second main surface on an opposite side of the first main surface, the flexible substrate containing a resin, and a wiring layer on the first main surface of the flexible substrate, the manufacturing method comprising:
cutting, by using a laser, the terminal portion such that the terminal portion has a slope toward the display portion from a side of the second main surface to a side of the first main surface; and
cleaning, by dry cleaning, an inclined surface formed in the cutting, wherein a width of the inclined surface formed in the cutting is equal to or greater than 13.1 µm and equal to or smaller than 167 µm in plan view of the flexible display panel.

8. The manufacturing method of the flexible display panel according to claim 7, wherein
in the cutting, a surface of the terminal portion is arranged on a defocus position shifted from a focus position of the laser, and
the laser is used to cut the surface of the terminal portion after the terminal portion is moved to the defocus position.

9. The manufacturing method of the flexible display panel according to claim 8, wherein
output power of the laser is equal to or greater than 3 W and equal to or smaller than 10 W, and
a length between the focus position and the surface is a length equal to or greater than 0 mm and equal to or smaller than 2.0 mm toward the side of the second main surface from the surface.

10. The manufacturing method of the flexible display panel according to claim 7, wherein, in the cleaning, a cleaning gas containing fine particles is sprayed on the inclined surface.

11. The manufacturing method of the flexible display panel according to claim 10, wherein
the fine particles include dry ice snow, and
the cleaning gas contains a carbon dioxide gas.

* * * * *